United States Patent
Yoon et al.

(10) Patent No.: US 10,515,784 B2
(45) Date of Patent: Dec. 24, 2019

(54) PLASMA TREATMENT APPARATUS AND METHOD OF PLASMA TREATING A SUBSTRATE USING THE SAME

(71) Applicant: Samsung Display Co., Ltd., Yongin-si, Gyeonggi-do (KR)

(72) Inventors: Youngsik Yoon, Seoul (KR); Jaehoon Jung, Anyang-si (KR); Daeho Yoon, Seoul (KR); Jonghwan Cho, Ansan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 722 days.

(21) Appl. No.: 15/157,344

(22) Filed: May 17, 2016

(65) Prior Publication Data

US 2017/0032932 A1 Feb. 2, 2017

(30) Foreign Application Priority Data

Jul. 27, 2015 (KR) .................. 10-2015-0106065

(51) Int. Cl.
*H01J 37/32* (2006.01)
*C23C 16/458* (2006.01)
*C23C 16/513* (2006.01)
*C23C 16/54* (2006.01)
*H05H 1/44* (2006.01)

(52) U.S. Cl.
CPC ........ *H01J 37/3244* (2013.01); *C23C 16/458* (2013.01); *C23C 16/513* (2013.01);
(Continued)

(58) Field of Classification Search
CPC ............. H01J 37/3244; H01J 37/32009; H01J 37/32715; H01J 37/32376;
(Continued)

(56) References Cited

U.S. PATENT DOCUMENTS

2005/0173655 A1* 8/2005 Naylor-Smith ..... H01J 37/3171
250/492.21
2008/0041430 A1* 2/2008 Cho ........................ B08B 3/024
134/58 R
(Continued)

FOREIGN PATENT DOCUMENTS

DE         4211746 A1 * 10/1993 ........... C23C 16/513
KR   10-2009-0073272          7/2009
(Continued)

OTHER PUBLICATIONS

English Machine Translation of Ritz et al. DE 4211746 retrieved from ESPACENET Feb. 14, 2019 (Year: 2019).*

*Primary Examiner* — Rakesh K Dhingra
*Assistant Examiner* — Laureen Chan
(74) *Attorney, Agent, or Firm* — Lewis Roca Rothgerber Christie LLP

(57) ABSTRACT

Exemplary embodiments of the inventive concept provide a plasma treatment apparatus with a substrate support unit, a plasma unit, a first rotation driving unit, and a gas supply part. The substrate support unit supports a substrate. The plasma unit generates a plasma and provides the plasma to the substrate. The first rotation driving unit is coupled to the plasma unit to rotate the plasma unit with respect to the substrate support unit. The gas supply part supplies a source gas to the plasma unit. The plasma unit includes a body, a first electrode located in the body, a second electrode located in the body and facing the first electrode, and a pipe located between the first and second electrodes to flow the source gas therethrough.

13 Claims, 10 Drawing Sheets

(52) U.S. Cl.
CPC ........ *C23C 16/54* (2013.01); *H01J 37/32009* (2013.01); *H01J 37/32715* (2013.01); *H01J 37/32779* (2013.01); *H05H 1/44* (2013.01)

(58) Field of Classification Search
CPC ........... H01J 37/32403; H01J 37/32532; H01J 37/32541; H01J 37/32596; H01J 37/32761; H01J 37/32779; H01J 2237/024; H01J 2237/04; H01J 2237/20214; H01J 2237/32; H05H 1/44; H05H 1/26; H05H 1/34; H05H 2001/4695; H05H 2001/4697; C23C 16/54; C23C 16/513; C23C 16/458
USPC .................................................. 118/723 DC
See application file for complete search history.

(56) References Cited

U.S. PATENT DOCUMENTS

| | | | | |
|---|---|---|---|---|
| 2009/0186167 A1* | 7/2009 | Tsuji | ................ | H01J 37/32366 427/569 |
| 2010/0147464 A1* | 6/2010 | Shibata | ................ | B08B 7/0035 156/345.44 |
| 2010/0319622 A1* | 12/2010 | Pei | ......................... | C23C 14/22 118/728 |
| 2011/0247558 A1* | 10/2011 | Pei | ......................... | C23C 14/50 118/723 R |
| 2012/0031333 A1* | 2/2012 | Kurita | ................ | C23C 16/4587 118/719 |
| 2012/0064728 A1* | 3/2012 | Yi | ............................ | C23C 14/50 438/758 |
| 2013/0316085 A1* | 11/2013 | Gindrat | ................... | C23C 4/134 427/446 |
| 2014/0326277 A1* | 11/2014 | Nettesheim | ....... | H01J 37/32403 134/1.1 |
| 2015/0042017 A1* | 2/2015 | Ramaswamy | ........ | C23C 16/513 264/446 |
| 2016/0148713 A1* | 5/2016 | Nam | ........................ | H05H 3/06 250/251 |

FOREIGN PATENT DOCUMENTS

| KR | 10-1051449 | 7/2011 |
|---|---|---|
| KR | 10-2013-0117994 | 10/2013 |
| KR | 10-2014-0027027 | 3/2014 |

* cited by examiner

PLASMA TREATMENT APPARATUS AND METHOD OF PLASMA TREATING A SUBSTRATE USING THE SAME

CROSS-REFERENCE TO RELATED APPLICATION

This application claims priority to and the benefit of Korean Patent Application No. 10-2015-0106065, filed on Jul. 27, 2015, the content of which is hereby incorporated by reference in its entirety.

BACKGROUND

1. Field

The present disclosure relates to a plasma treatment apparatus and methods of plasma treating a substrate using the same.

2. Description of the Related Art

A plasma treatment apparatus may perform various treatment processes on a substrate using plasma. For instance, a plasma treatment apparatus may perform a surface treatment process on a substrate. The surface treatment process may modify a surface of the substrate and a surface energy of the surface increases due to the surface treatment process.

The surface treatment process may be applied as part of a process used to form coating layers on the substrate. For example, when the surface treatment process is performed on a first coating layer after the first coating layer is formed on the substrate, an adhesive strength between the first coating layer and a second coating layer formed on the first coating layer may be improved.

A mobile display device (e.g., a smart phone) may include a window covering a display screen. The window may be formed of a plastic material, and coating layers may be formed on the window to improve the hardness of the window. In addition, a surface treatment process may be applied when the coating layers are formed on the window, and thus the adhesive strength between the coating layers may be improved.

SUMMARY

Aspects of example embodiments of the present disclosure provide a plasma treatment apparatus capable of easily performing a plasma treatment process on a variety of substrates.

The present disclosure provides methods of plasma treating the substrate using the plasma treatment apparatus.

Embodiments of the inventive concept provide a plasma treatment apparatus including a substrate support unit, a plasma unit, a first rotation driving unit, and a gas supply part.

In some embodiments, the substrate support unit supports a substrate. The plasma unit generates a plasma and provides the plasma to the substrate. The first rotation driving unit is coupled to the plasma unit to rotate the plasma unit with respect to the substrate support unit. The gas supply part supplies a source gas to the plasma unit.

In some embodiments, the plasma unit may include a body, a first electrode located in the body, a second electrode located in the body and facing the first electrode, and a pipe (e.g., a tube) located between the first and second electrodes to flow the source gas therethrough.

In some embodiments, the first rotation driving unit may include a first rotation axis and a first rotation driving part. The outlet of the plasma unit may rotate in a clockwise direction or a counter-clockwise direction by the first rotation driving unit when viewed in a side view (e.g., relative to the first rotation axis).

In some embodiments, the plasma treatment apparatus may further include a second rotation driving unit. The second rotation driving unit may be coupled to the plasma unit to rotate the plasma unit in a clockwise direction or a counter-clockwise direction by the first rotation driving unit when viewed in a plan view (e.g., relative to the first rotation axis).

In some embodiments, the plasma treatment apparatus may further include a third rotation driving unit. The third rotation driving unit may be coupled to the plasma unit to change a direction to which the outlet of the plasma unit faces to a lower end portion of the chamber from an upper end portion of the chamber.

Embodiments of the inventive concept provide a method of plasma treating a substrate as follows. The substrate is located in a chamber. A plasma unit generating a plasma rotates with respect to the substrate and the substrate rotates with respect to the plasma unit.

According to some embodiments, at least one of the plasma unit and the substrate rotates to allow an outlet of the plasma unit to face a bending portion of the substrate (e.g., a curved surface portion).

According to some embodiments, the plasma units rotate in the reactive space of the chamber by the rotation driving units. Thereby, the outlets of the plasma units may be controlled to face various directions, and as a result, the plasma discharged through the outlets may be isotropically supplied to the substrate.

As a result, a surface treatment process may be uniformly performed on an entire surface of the substrate by using the plasma units. In addition, the surface treatment process may be easily performed on the bending portion of the substrate.

BRIEF DESCRIPTION OF THE DRAWINGS

The above and other features of the present disclosure will become readily apparent by reference to the following detailed description when considered in conjunction with the accompanying drawings wherein.

DETAILED DESCRIPTION

Figure 1:
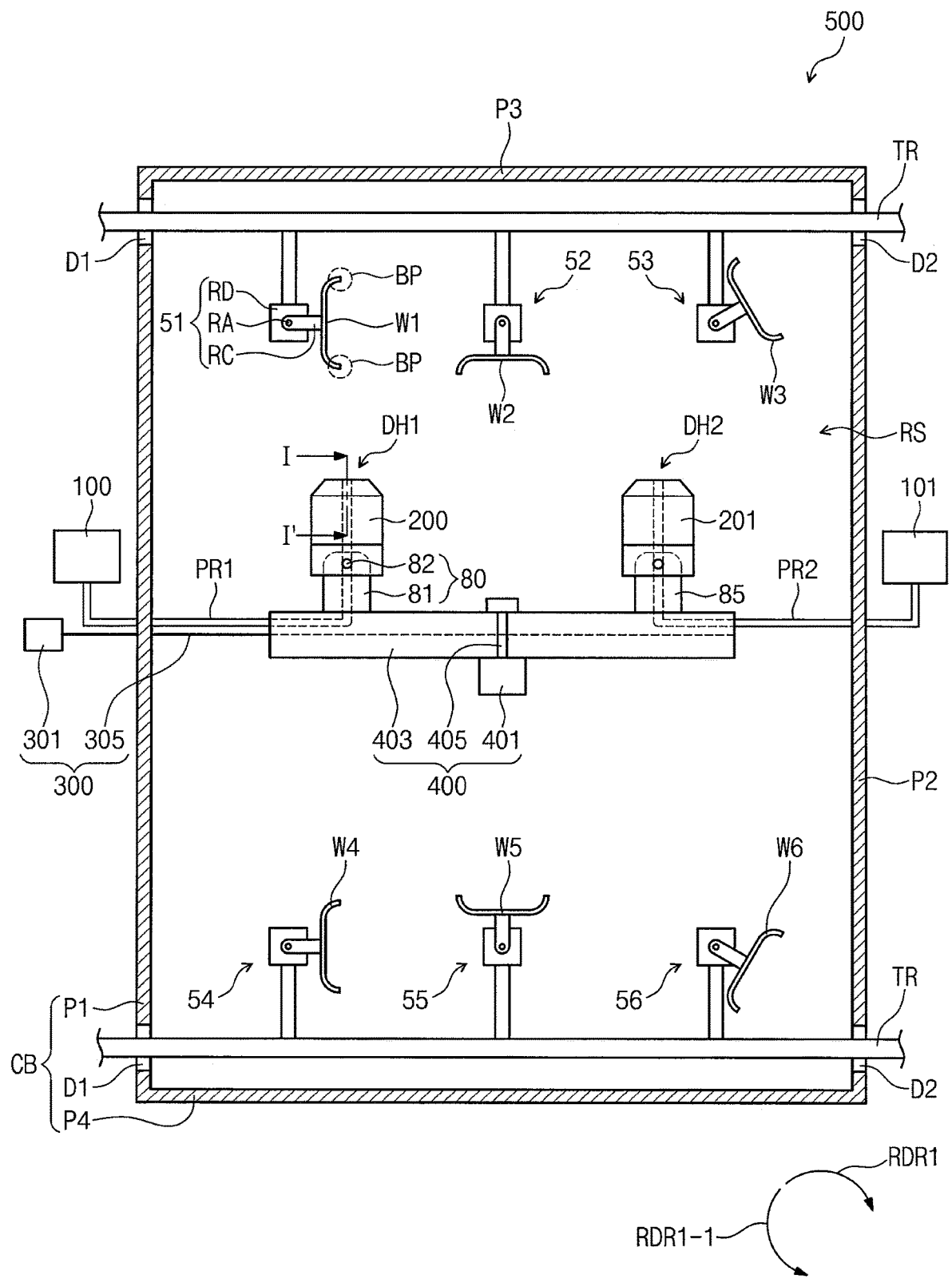
FIG. 1 is a side view showing a plasma treatment apparatus according to some exemplary embodiments of the present disclosure.

Hereinafter, exemplary embodiments of the present invention will be described with reference to accompanying drawings. In the following description, the same reference numerals will be assigned to elements and structures having substantially the same function or configuration and detailed descriptions thereof will be omitted in order to avoid redundancy.

In the drawings, the thickness of layers, films, and regions may be exaggerated for clarity. It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2A:
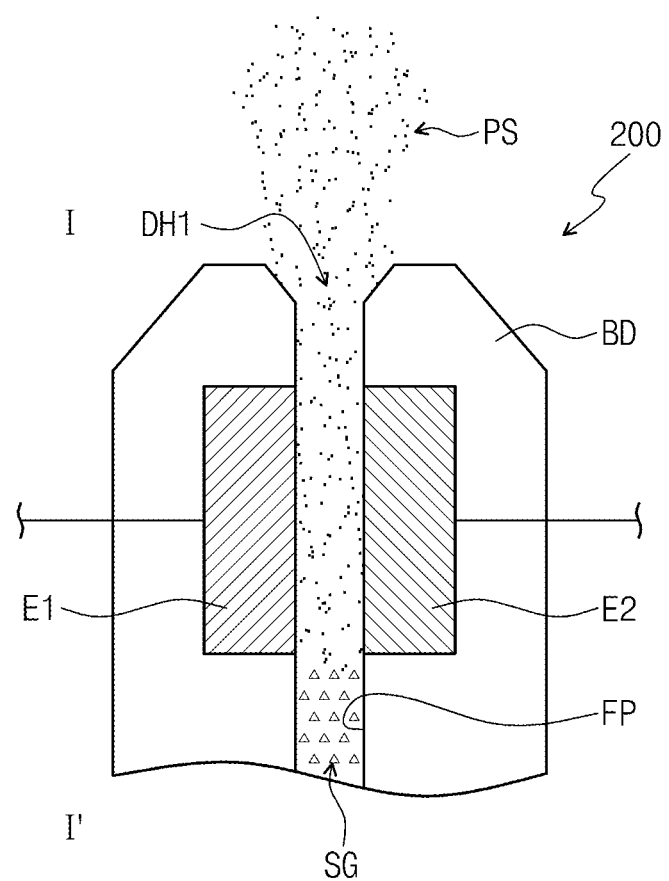
FIG. 2A is a cross-sectional view showing a first plasma unit, the cross section being taken along the line I-I' shown in FIG. 1.

FIG. 1 is a side view showing a plasma treatment apparatus 500 according to some exemplary embodiments of the present disclosure. FIG. 2A is a cross-sectional view showing a first plasma unit 200, the cross section being taken along the line I-I' shown in FIG. 1, and FIG. 2B is a plan view showing plasma units 200 and 201 shown in FIG. 1.

Figure 2B:
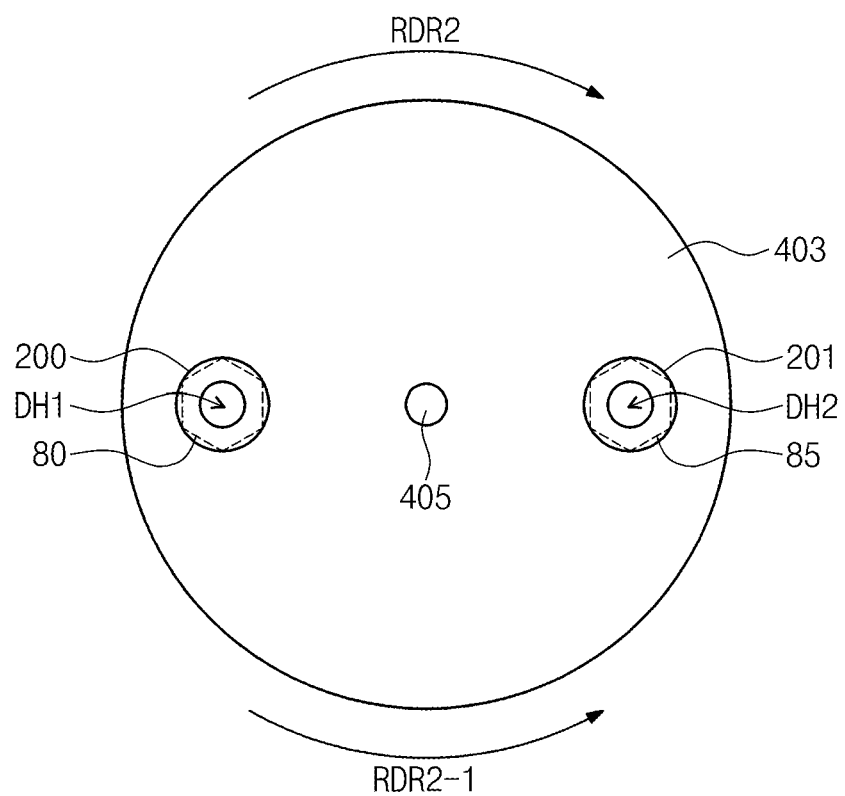
FIG. 2B is a plan view showing plasma units according to FIG. 1.

Referring to FIGS. 1, 2A, and 2B, the plasma treatment apparatus 500 may perform a plasma treatment on each of substrates W1, W2, W3, W4, W5, and W6, In some exemplary embodiments, each of the substrates W1 to W6 may be, but is not limited to, a window covering a display part of a display device, and each of the substrates W1 to W6 may include a bending portion BP having a curved surface.

In some exemplary embodiments, the plasma treatment apparatus 500 may include a chamber CB, substrate support units 51, 52, 53, 54, 55, and 56, gas supply parts 100 and 101, plasma units 200 and 201, first rotation driving units 80 and 85, a second rotation driving unit 400, and a third rotation driving unit 300.

The chamber CB may include an upper end portion P3, a lower end portion P4, and a plurality of sidewalls connecting the upper end portion P3 and the lower end portion P4. For example, FIG. 1 shows a first sidewall P1 and a second sidewall P2 facing the first sidewall P1, but the chamber CB is not limited thereto or thereby. The chamber CB is provided with a reactive space RS defined therein, in which the plasma treatment is performed on the substrates W1 to W6.

In some exemplary embodiments, the reactive space RS may be maintained in a vacuum state. In such embodiments, the plasma treatment apparatus 500 may further include a vacuum pump (not shown) connected to the reactive space RS.

However, the reactive space RS should be understood as not limited to being maintained in a vacuum state. That is, the reactive space RS may be maintained in an atmospheric-pressure state according to some embodiments.

In some exemplary embodiments, a substrate entrance D1 and a substrate exit D2 are each adjacent the upper end portion P3 and the lower end portion P4 of the chamber CB. The substrate entrance D1 extends through the first sidewall P1 and the substrate exit D2 extends through the second sidewall D2.

The plasma treatment apparatus 500 may further include a transfer rail TR to transfer the substrates W1 to W6. The transfer rail TR crosses the reactive space RS with one end of the transfer rail TR outside of substrate entrance D1 of the chamber CB, and the other end of the transfer rail TR outside of substrate exit D1 of the chamber CB. In some embodiments, the substrates W1 to W6 enter into the reactive space RS through the substrate entrance D1 and exit outside of the chamber CB through the substrate exit D2.

The substrate support units 51 to 56 (e.g., substrate supports) support the substrates W1 to W6, respectively, and rotate the substrates W1 to W6 in the reactive space RS, as further described below.

In some embodiments, the substrate support units 51 to 53 are adjacent to the upper end portion P3 of the chamber CB and the substrate support units 54 to 56 are adjacent to the lower end portion P4 of the chamber CB. Because the substrate support units 51 to 56 may have substantially the same structure and function, a first substrate support unit 51 (of the substrate support units 51 to 56) will be described in detail as a representative example, and a first substrate W1 (of the substrates W1 to W6 will be described in detail as a representative example. The first substrate W1 is coupled to the first substrate support unit 51 (for example, see FIG. 1).

In some embodiments, the first substrate support unit 51 may include a driving part RD, a rotation axis RA, and a holding part RC (for example, see FIG. 1). The driving part RD includes a motor to generate a rotational force and the rotation axis RA (e.g., a rotation shaft having the rotation axis RA) is connected to the driving part RD to receive the rotational force from the driving part RD. One end of the holding part RC is connected to the rotation axis RA and the other end of the holding part RC holds the first substrate W1.

In some exemplary embodiments, the holding part RC may include a chuck (not shown) to hold the first substrate W1 and the chuck may include a support pin (not shown) making contact with the first substrate W1.

When a rotational force is generated by the driving part RD, the rotational force is applied to the rotation axis RA, and the holding part RC rotates in a first clockwise direction RDR1 or a first counter-clockwise direction RDR1-1 in the reactive space RS when viewed from a side surface (i.e., rotates about rotation axis RA, for example, see FIG. 1). The first substrate W1 is interlocked with the rotation of the holding part RC and rotates in the first clockwise direction RDR1 or the first counter-clockwise direction RDR1-1 in the reactive space RS (e.g., depending on the rotation of the holding part RC).

In some embodiments where the first substrate W1 rotates in the reactive space RS (i.e., rotating about rotation axis RA), an upper surface of the first substrate W1, a lower surface of the first substrate W1, and the curved surface of the bending portion BP may be oriented toward the plasma units 200 and 201. The plasma generated by the plasma units 200 and 201 (e.g., plasma generators) may be uniformly applied to the entire surface of the first substrate W1, and as a result, a surface treatment process may be uniformly performed on the entire surface of the first substrate W1 by the plasma provided from the plasma units 200 and 201.

In some embodiments, the gas supply parts 100 and 101 (e.g., gas suppliers) may provide the plasma units 200 and 201 with a source gas SG. The gas supply parts 100 and 101 include a first gas supply part 100 and a second gas supply part 101 and the plasma units 200 and 201 include a first plasma unit 200 and a second plasma unit 201. The first gas supply part 100 provides the source gas SG to the first plasma unit 200 through a first gas line PR1 and the second gas supply part 101 provides the source gas SG to the second plasma unit 201 through a second gas line PR2.
The first gas supply part 100 provides the source gas SG to the first plasma unit 200 through a first gas line PR1 and the second gas supply part 101 provides the source gas SG to the second plasma unit 201 through a second gas line PR2.

In some exemplary embodiments, the source gas SG may include at least one of: an argon gas, a hydrogen gas, a nitrogen gas, and an oxygen gas.

The first and second gas lines PR1 and PR2 may have a flexible shape. For instance, the first and second gas lines PR1 and PR2 may be a hose formed of a plastic material. Accordingly, when the first and second plasma units 200 and 201 rotate, the first and second gas lines PR1 and PR2 may be flexible. As a result, the source gas SG may be stably provided to the first and second plasma units 200 and 201 through the first and second gas lines PR1 and PR2. In some embodiments, the first and second plasma units 200 and 201 receive the source gas SG from the first and second gas supply parts 100 and 101 and generate the plasma PS. The first plasma unit 200 may include a first outlet DH1 through which the plasma PS is discharged (for example, the first plasma unit 200 and/or the first outlet DH1 may be located in the reactive space RS) and the second plasma unit 201 may include a second outlet DH2 through which the plasma PS is discharged (for example, the second plasma unit 201 and/or the second outlet DH2 may be located in the reactive space RS). Therefore, when the first and second plasma units 200 and 201 are operated, the reactive space RS is filled with the plasma PS. The first and second plasma units 200 and 201 may have substantially the same structure and function, and thus the first plasma unit 200 will be described in detail as a representative example.

The first plasma unit 200 may include a body BD, a first electrode E1, a second electrode E2, and a pipe FP (for example, see FIG. 2A). The first outlet DH1 is located at one end of the body BD. The first and second electrodes E1 and E2 are located in the body BD and face each other such that the pipe FP (e.g., a tube) is located between the first and second electrodes E1 and E2.

In some embodiments, the first and second electrodes E1 and E2 may be connected to a direct-current power source, forming an electric field EF between the first and second electrodes E1 and E2. When the source gas SG is provided through the pipe FP while the electric field EF is formed, the source gas SG is converted to an ionic state by electrons provided from one of the first and second electrodes E1 and E2, such that the plasma PS is generated. In addition, the generated plasma PS is discharged through the first outlet DH1.

In some embodiments, the first rotation driving units 80 and 85 may be coupled to the plasma units 200 and 201, respectively (e.g., in a one-to-one correspondence). Because the first rotation driving units 80 and 85 may have substantially the same structure and function, hereinafter, only one first rotation driving unit 80 will be described in detail with reference to FIGS. 3A and 3B as a representative example.

Figure 3A:
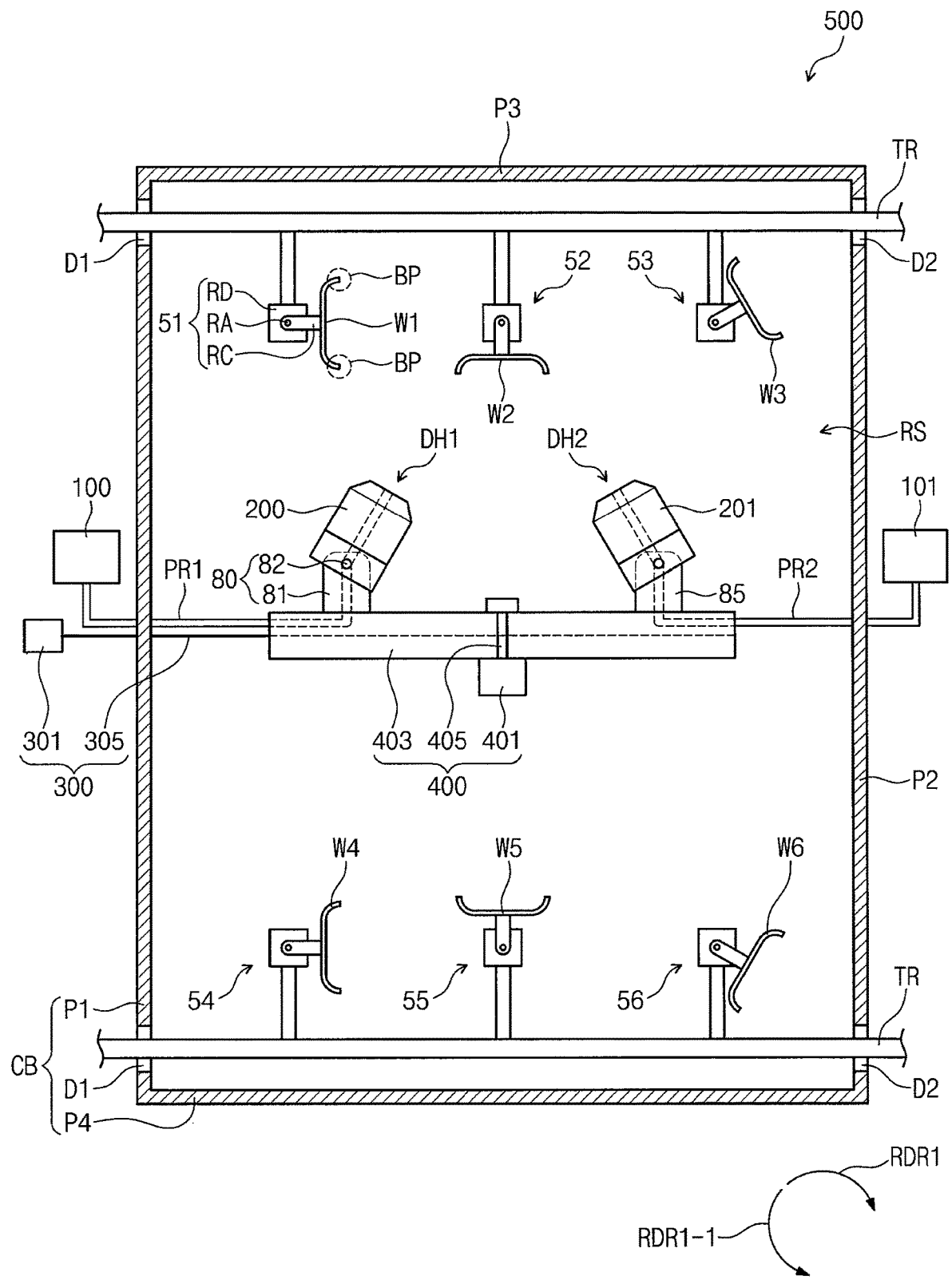
FIGS. 3A and 3B are side views showing plasma units rotated by a first rotation driving unit according to some embodiments.
Figure 3B:
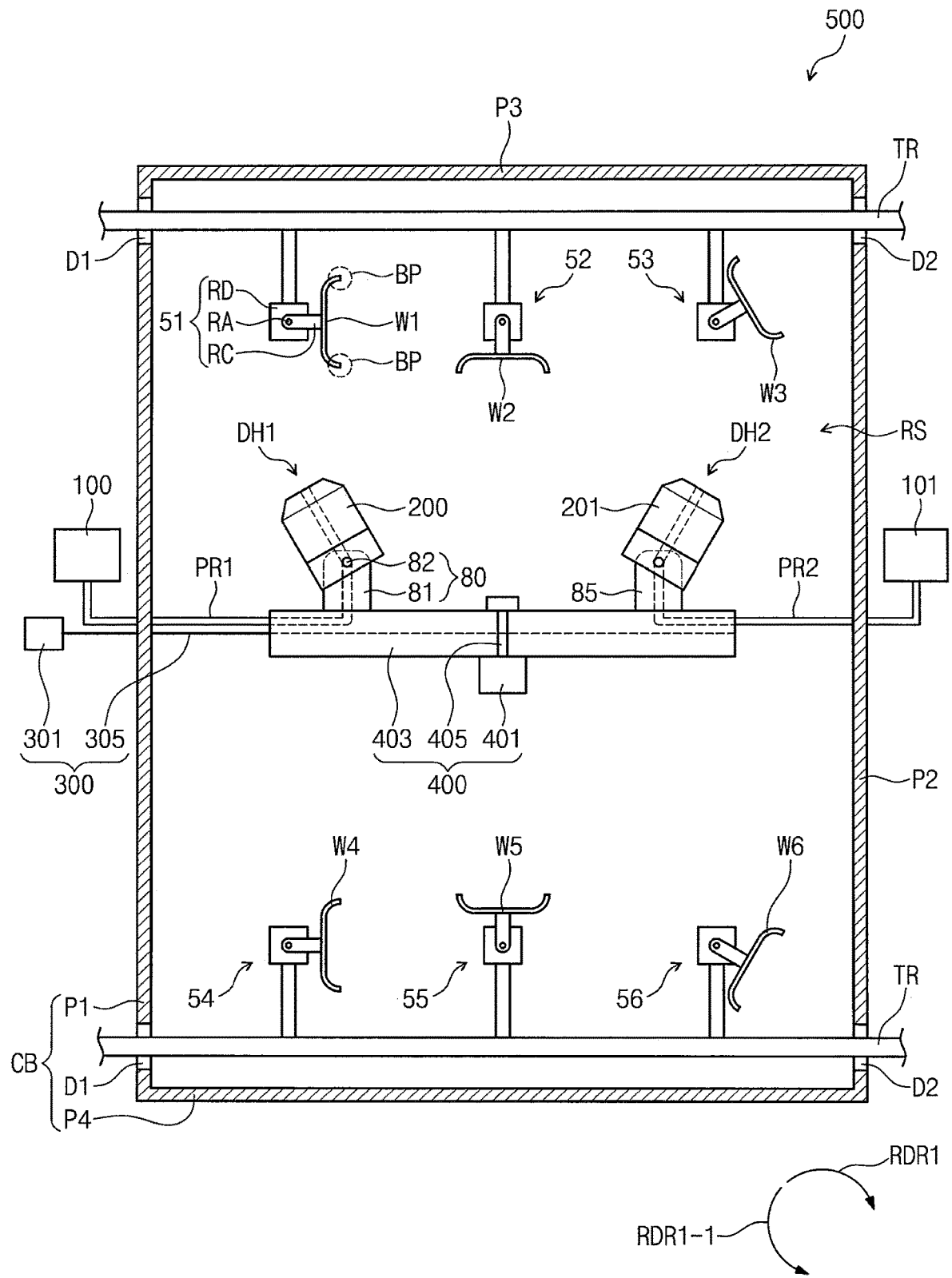

FIGS. 3A and 3B are side views showing the plasma units 200 and 201 rotated by the first rotation driving unit 80 according to some embodiments.

Referring to FIGS. 1, 3A, and 3B, the first rotation driving unit 80 (e.g., first rotation driver) may include a first rotation driving part 81 and a first rotation axis 82. The first rotation driving part 81 may include a motor to generate a rotational force and the first rotation axis 82 may be connected to the first rotation driving part 81 to receive the rotational force from the first rotation driving part 81.

The first rotation axis 82 may be coupled to the first plasma unit 200. Accordingly, when the first rotation driving part 81 is operated to rotate the first rotation axis 82, the first plasma unit 200 rotates by the rotation of the first rotation axis 82. Specifically, the first outlet DH1 of the first plasma unit 200 rotates in the first clockwise direction RDR1 or the first counter-clockwise direction RDR1-1 when viewed in a side surface (for example, see FIGS. 3A and 3B). As a result, the plasma PS discharged through the first outlet DH1 may be uniformly provided to the entire surface of each of the substrates W1, W2, and W3.

The second rotation driving unit 400 (e.g., second rotation driver) may be coupled to the first and second plasma units 200 and 201. Hereinafter, the structure and function of the second rotation driving unit 400 will be described in detail with reference to FIG. 3C.

Figure 3C:
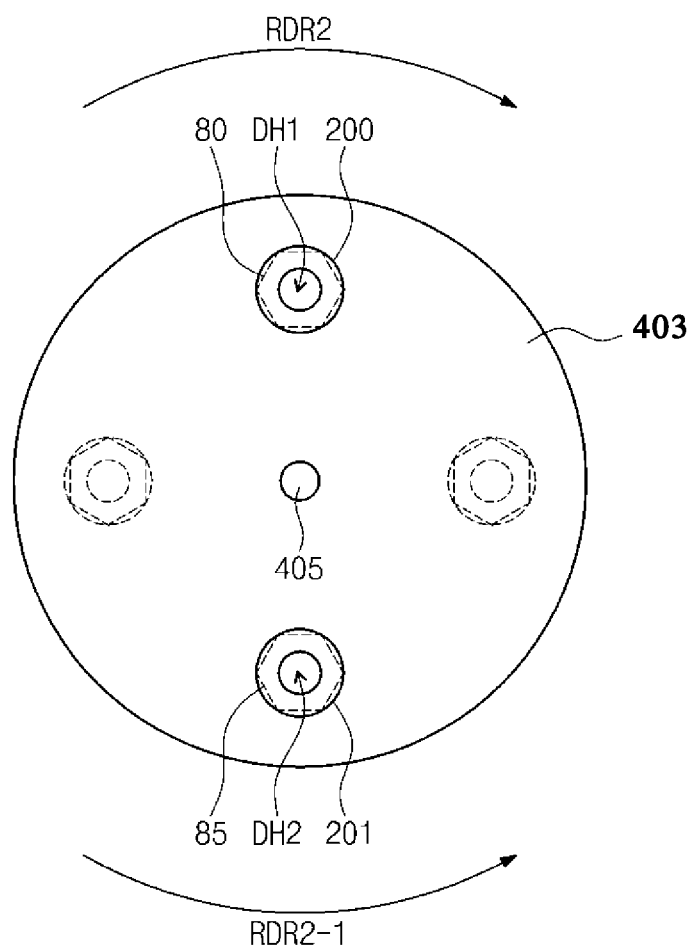
FIG. 3C is a plan view showing plasma units rotated by a second rotation driving unit according to some embodiments.

FIG. 3C is a plan view showing plasma units rotated by the second rotation driving unit 400 according to some embodiments.

Referring to FIGS. 1 and 3C, the second rotation driving unit 400 may include a second rotation driving part 401, a second rotation axis 405, and a support part 403.

The second rotation driving part 401 may include a motor to generate a rotational force. The second rotation axis 405 may be coupled to the second rotation driving part 401 to receive the rotational force. The support part 403 may be coupled to the second rotation axis 405 and rotates in a second clockwise direction RDR2 or a second counter-clockwise direction RDR2-1 by the rotational force when viewed in a plan view (for example, see FIG. 3C).

In some exemplary embodiments, the support part 403 may have a substantially circular plate shape, but is not limited thereto or thereby. In some embodiments, for instance, the support part 403 may have a frame shape connecting the first and second plasma units 200 and 201.

The support part 403 may be coupled to the first rotation driving units 80 and 85, the first plasma unit 200, and the second plasma unit 201. Thus, in some embodiments where the support part 403 rotates in the second clockwise direction RDR2 or the second counter-clockwise direction RDR2-1 in accordance with the driving of the second rotation driving unit 400 (for example, see FIG. 3C), the first and second plasma units 200 and 201 rotate in the second clockwise direction RDR2 or the second counter-clockwise direction RDR2-1 when viewed in the plan view (i.e., based on the rotation of the second rotation driving unit 400).

In addition, in some embodiments where the first rotation driving units 80 and 85 and the second rotation driving unit 400 are substantially simultaneously driven, the first and second plasma units 200 and 201 rotate not only in the first clockwise direction RDR1 and the first counter-clockwise direction RDR1-1 but also in the second clockwise direction RDR2 or the second counter-clockwise direction RDR2-1. Accordingly, the first and second outlets DH1 and DH2 of the first and second plasma units 200 and 201 may be controlled to face various directions, and as a result, the plasma PS discharged through the first and second outlets DH1 and DH2 may be isotropically supplied to the substrates W1, W2, and W3.

A third rotation driving unit 300 (e.g., third rotation driver) may be coupled to the first and second plasma units 200 and 201. Hereinafter, the structure and function of the third rotation driving unit 300 will be described in detail with reference to FIG. 3D.

Figure 3D:
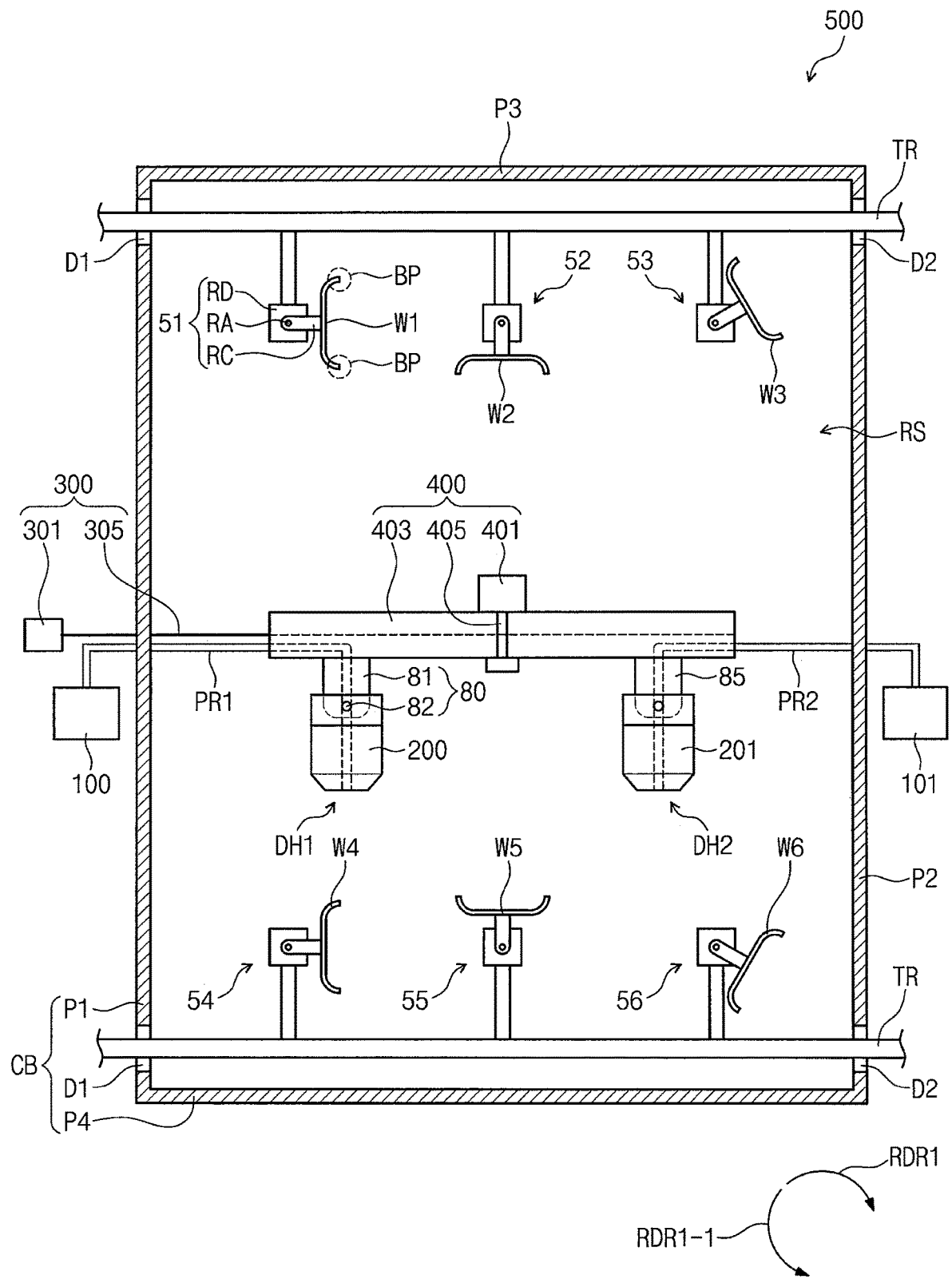
FIG. 3D is a side view showing plasma units rotated by a third rotation driving unit according to some embodiments.

FIG. 3D is a side view showing plasma units rotated by the third rotation driving unit 300 according to some embodiments.

Referring to FIGS. 1 and 3D, the third rotation driving unit 300 may include a third rotation driving part 301 and a third rotation axis 305.

The third rotation driving part 301 may include a motor to generate a rotational force. One end of the third rotation axis 305 may be coupled to the third rotation driving part 301 and the other end of the third rotation axis 305 may be fixed to the support part 403. As a result, the rotational force generated by the third rotation driving part 301 may be applied to the support part 403 through the third rotation axis 305, and thus the support part 403 may rotate by the rotational force.

In addition, in some embodiments, the orientation of the support part 403 relative to the third rotation axis 305 may be reversed by the rotation of the third rotation driving part 301. As a result, the orientation of the first and second plasma units 200 and 201 (located on the support part 403) relative to the third rotation axis 305 may be reversed. Accordingly, the direction to which the first and second outlets DH1 and DH2 face may be changed from the upper end portion P3 of the chamber CB to the lower end portion P4 of the chamber CB.

As shown in FIG. 1, in some embodiments where the first and second plasma units 200 and 201 face the upper end portion P3 of the chamber CB, the substrates W1 to W3 (adjacent to the upper end portion P3) may be plasma treated. In addition, as shown in FIG. 3D, in some embodiments where the first and second plasma units 200 and 201 face the lower end portion P4 of the chamber CB, the substrates W4 to W6 (adjacent to the lower end portion P4) may be plasma treated.

In some embodiments, the direction to which the first and second outlets DH1 and DH2 face (e.g., upper end portion P3 or lower end portion P4) may be controlled by using the third rotation driving unit 300 (e.g., to rotate third rotation axis 305). As a result, the plasma treatment process may be substantially simultaneously performed on the substrates W1 to W6 located at the upper and lower end portions P3 and P4 of the chamber CB.

Figure 4:
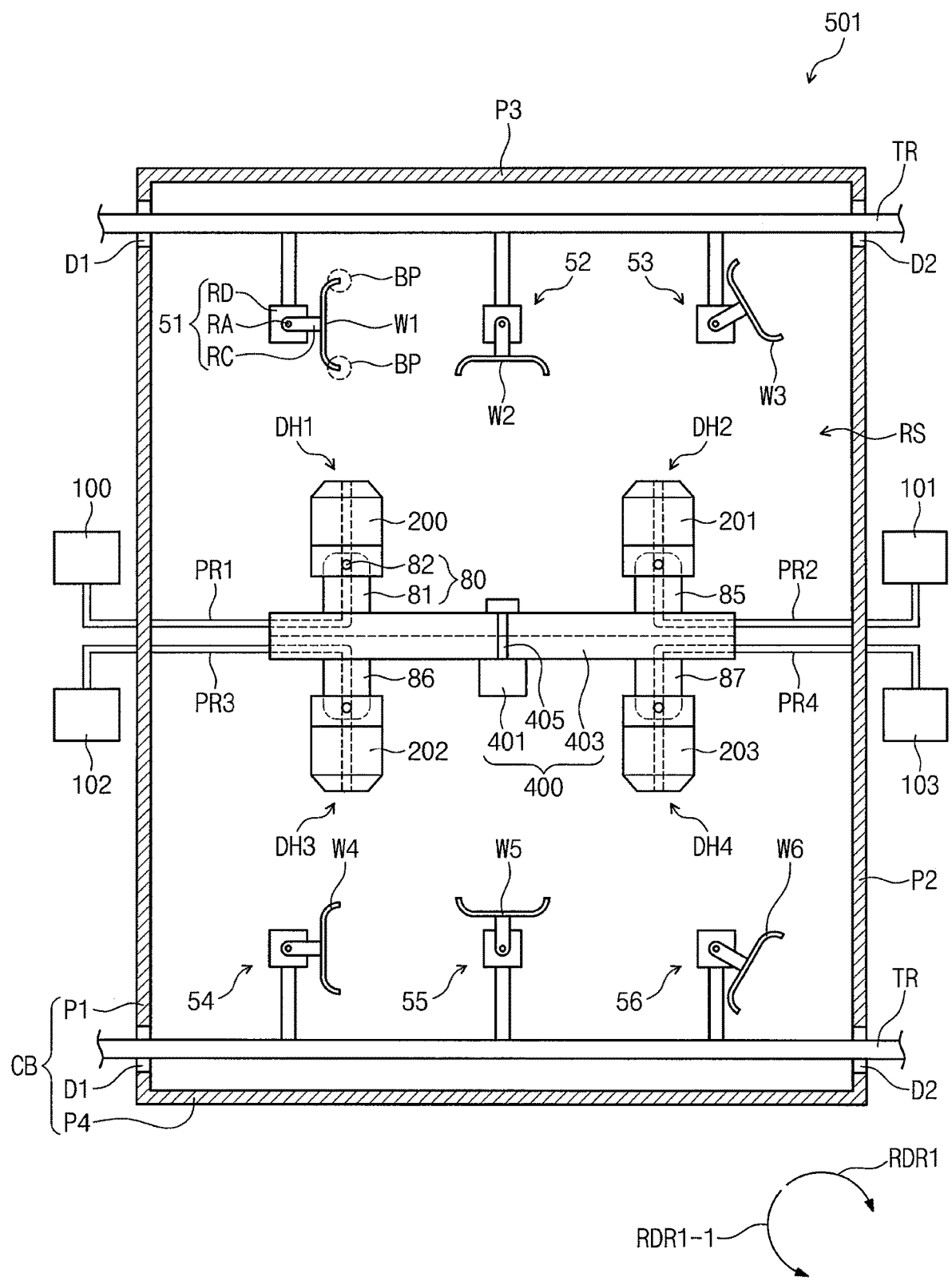
FIG. 4 is a side view showing a plasma treatment apparatus according to some exemplary embodiments of the present disclosure.

FIG. 4 is a side view showing a plasma treatment apparatus 501 according to some exemplary embodiments of the present disclosure. In FIG. 4, the same reference numerals denote the same elements in the above-mentioned embodiments, and thus detailed descriptions of the same elements will be omitted.

Referring to FIG. 4, the plasma treatment apparatus 501 may include a chamber CB, substrate support units 51 to 56, gas supply parts 100, 101, 102, and 103, plasma units 200, 201, 202, and 203, first rotation driving units 80, 85, 86, and 87, and a second rotation driving unit 400.

In some exemplary embodiments, the plasma units 200 to 203 are located at upper and lower end portions of the support part 403. Specifically, the first and second plasma units 200 and 201 may be located at the upper end portion of the support part 403 and the third and fourth plasma units 202 and 203 may be located at the lower end portion of the support part 403.

In some embodiments, the gas supply parts 100 to 103 correspond to the plasma units 200 to 203, respectively, and supply the source gas to the plasma units 200 to 203. The gas supply units 100 to 103 may include first, second, third, and fourth gas lines PR1, PR2, PR3, and PR4 and the first to fourth gas lines PR1 to PR4 may be connected to the plasma units 200 to 203, respectively (e.g., in a one-to-one correspondence).

The first rotation driving units 80, 85, 86, and 87 may be coupled to the plasma units 200 to 203, respectively (e.g. in a one-to-one correspondence), to rotate the plasma units 200 to 203 in a first clockwise direction RDR1 and a first counter-clockwise direction RDR1-1 when viewed in the side view (for example, see FIG. 4).

In some embodiments, the second rotation driving unit 400 may be coupled to the plasma units 200 to 203 to rotate the plasma units 200 to 203 in a second clockwise direction RDR2 and a second counter-clockwise direction RDR2-1 when viewed in the side view (for example, see FIG. 2B). In the reactive space RS, a space corresponding to an upper portion of the support part 403 will be referred to herein as an upper reactive space and a space corresponding to a lower portion of the support part 403 will be referred to herein as a lower reactive space. When the first rotation driving units 80, 85, 86, and 87 and the second rotation driving unit 400 are driven, the direction in which each of first and second outlets DH1 and DH2 of the first and second plasma units 200 and 201 faces may be randomly determined in the upper reactive space, and the direction in which each of third and fourth outlets DH3 and DH4 of the third and fourth plasma units 202 and 203 faces may be randomly determined in the lower reactive space.

Accordingly, the plasma discharged through the first and second outlets DH1 and DH2 may be isotropically supplied to substrates W1, W2, and W3 adjacent to the upper end portion P3, and the plasma discharged through the third and fourth outlets DH3 and DH4 may be isotropically supplied to substrates W4, W5, and W6 adjacent to the lower end portion P4.

Figure 5A:
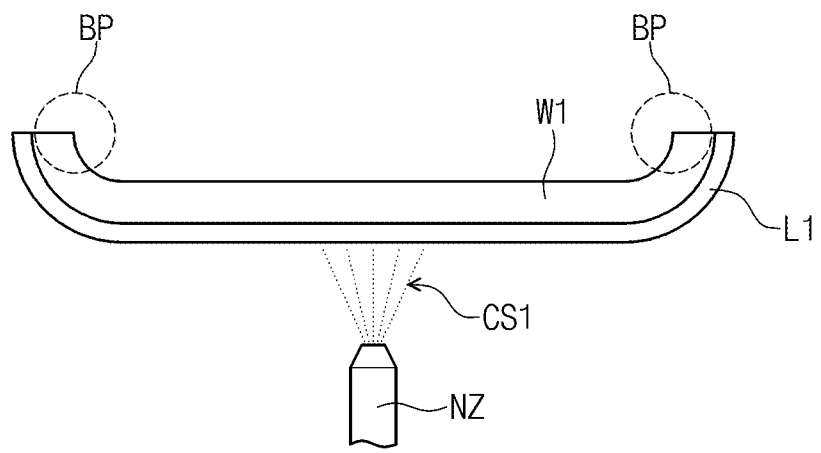
FIGS. 5A to 5C are views showing methods of plasma treating a substrate according to some embodiments using the plasma treatment apparatus shown in FIG. 1 when a plurality of coating layers is formed on the substrate.
Figure 5B:
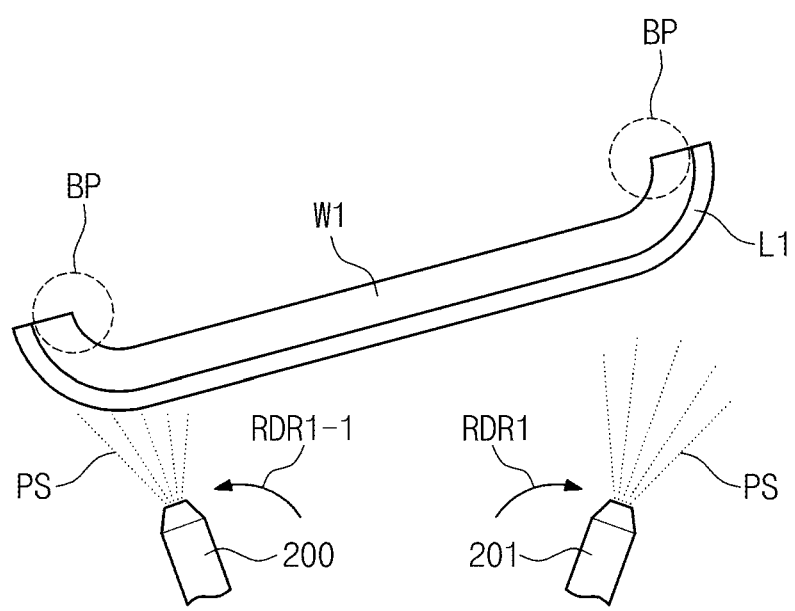
Figure 5C:
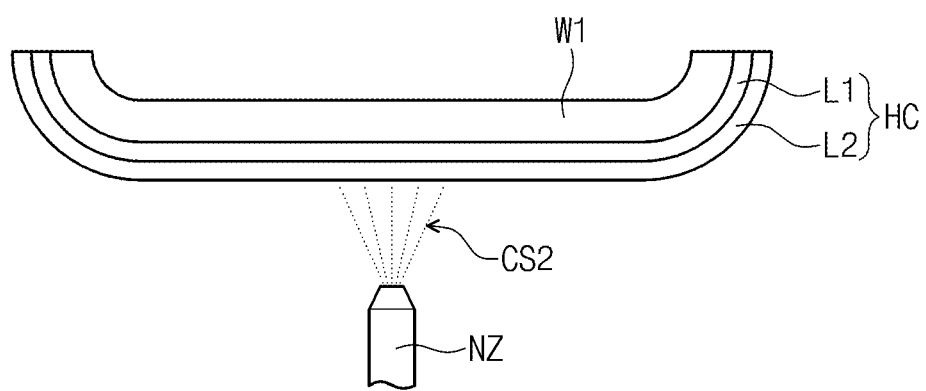

FIGS. 5A to 5C are views showing a method of plasma treating the substrate W1 using the plasma treatment apparatus shown in FIG. 1 when a plurality of coating layers HC is formed on the substrate W1, according to some embodiments.

Referring to FIG. 5A, a spray unit NZ may provide a first coating solution CS1 to the substrate W1 to form a first coating layer L1 on the substrate W1. In some exemplary embodiments, the substrate W1 may be, but is not limited to, a window covering a display screen of a display device and the substrate W1 may include a bending portion BP to cover a curved surface of the display screen.

The first coating solution CS1 may include an organic material, an inorganic material, or a hybrid material obtained by mixing an organic material and an inorganic material. For instance, the organic material may include an acryl-based compound and an epoxy-based compound and the inorganic material may include silica and aluminum.

Referring to FIG. 5B, the plasma treatment process may be performed on the substrate W1 (on which the first coating layer L1 is formed) using the plasma treatment apparatus 500 described with reference to FIG. 1. For example, in more detail, the plasma units 200 and 201 of the plasma treatment apparatus may be driven to generate the plasma PS and the plasma PS may be supplied to an exposed surface of the first coating layer L1. Accordingly, the plasma treatment process may be performed on the exposed surface of the first coating layer L1 by the plasma PS.

In some exemplary embodiments, as described with reference to FIGS. 1, 3A, and 3B, the plasma units 200 and 201 may rotate when the plasma treatment process is performed. Specifically, when the first rotation driving units 80 and 85 are driven, the plasma units 200 and 201 rotate in the first clockwise direction RDR1 and the first counter-clockwise direction RDR1-1 (for example, see FIG. 1).

In addition, when the plasma treatment process is performed, the second rotation driving unit 400 may be driven to rotate the plasma units 200 and 201 in the second clockwise direction RDR2 and the second counter-clockwise direction RDR2-1 when viewed in a plan view as described with reference to FIGS. 1 and 3C.

Further, when the plasma treatment process is performed, the substrate W1 may rotate as described with reference to FIG. 1. More particularly, the substrate W1 may rotate in the first clockwise direction RDR1 and the first counter-clockwise direction RDR1-1 by the substrate support unit 51 (for example, see FIG. 1).

Therefore, the plasma PS discharged from the plasma units 200 and 201 may be isotropically supplied to the substrate W1 by the driving of the first and second rotation driving units. As a result, the flat portion of the window W1 and the surface of the first coating layer L1 formed on the bending portion BP may be uniformly plasma treated.

In some exemplary embodiments, when the plasma treatment process is performed, the plasma units 200 and 201 relative to the third rotation axis 305 may be reversed (e.g., up and down) by the driving of the third rotation driving unit 300 as described with reference to FIGS. 1 and 3D (e.g., the orientation of plasma units 200 and 201 can be reversed). In such embodiments, although a plurality of substrates W1 to W6 are located at the upper and lower end portions P3 and P4 of the chamber CB, the plasma treatment process may be easily performed on the substrates W1 to W6 because the orientation of the plasma units 200 and 201 relative to the third rotation axis 305 may be reversed by the third rotation driving unit 300.

Referring to FIG. 5C, after the surface treatment process is completely performed on the first coating layer L1, the spray unit NZ may provide a second coating solution CS2 to the substrate W1 to form a second coating layer L2 on the first coating layer L1.

Similar to the first coating solution CS1, the second coating solution CS2 may include an organic material, an inorganic material, or a hybrid material obtained by mixing the organic material and the inorganic material.

As described with reference to FIG. 5B, the surface of the first coating layer L1 may be plasma treated before the second coating layer L2 is formed. Thus, in some embodiments where the second coating layer L2 is formed on the first coating layer L1, the adhesive strength between the first coating layer L1 and the second coating layer L2 may be improved. As a result, although the coating layers HC include the first and second coating layers L1 and L2 stacked one on another (for example, see FIG. 5C), the first and second coating layers L1 and L2 may be prevented from being separated from each other.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A plasma treatment apparatus comprising:
    a substrate support configured to support a substrate;
    a plasma generator configured to generate a plasma and provide the plasma to the substrate via an outlet of the plasma generator;
    a first rotation driver coupled to the plasma generator to rotate the plasma generator with respect to the substrate support;
    a gas supplier comprising a gas line configured to supply a source gas to the plasma generator;
    a chamber housing the substrate support, the plasma generator, and the first rotation driver, the chamber having an upper wall, an opposite lower wall, and sidewalls between the upper wall and lower wall; and
    a third rotation driver coupled to the plasma generator and configured to change a direction to which the outlet of the plasma generator faces from the upper wall of the chamber to the lower wall of the chamber.

2. The plasma treatment apparatus of claim 1, wherein the outlet of the plasma generator is configured to rotate toward the sidewalls of the chamber by the first rotation driver, and wherein the sidewalls of the chamber face each other.

3. The plasma treatment apparatus of claim 2, wherein the first rotation driver comprises:
    a first rotation shaft coupled to the plasma generator; and
    a first rotation motor configured to drive the first rotation shaft to generate a rotational force on the first rotation shaft, and the outlet of the plasma generator is configured to rotate in a clockwise direction or a counter-clockwise direction by the first rotation driver when viewed in a side view.

4. The plasma treatment apparatus of claim 2, further comprising a second rotation driver coupled to the plasma generator to rotate the plasma generator in a clockwise direction or a counter-clockwise direction by the second rotation driver when viewed in a plan view.

5. The plasma treatment apparatus of claim 4, wherein the second rotation driver comprises:
   a second rotation motor configured to generate a rotational force;
   a second rotation shaft coupled to the second rotation motor to receive the rotational force from the second rotation motor; and a support comprising a surface for supporting the plasma generator, the support coupled to the plasma generator and the second rotation shaft to be rotated.

6. The plasma treatment apparatus of claim 5, wherein the plasma generator and the first rotation driver are located on the surface of the support.

7. A plasma treatment apparatus comprising:
   a substrate support configured to support a substrate;
   a plurality of plasma generators configured to each generate a plasma and provide the plasma to the substrate, each having an outlet;
   a first rotation driver coupled to each one of the plurality of plasma generators to rotate the one of the plurality of plasma generators with respect to the substrate support;
   a gas supplier configured to supply a source gas to each one of the plurality of plasma generators;
   a chamber housing the substrate support, the plurality of plasma generators, and the first rotation driver, the chamber having an upper wall, an opposite lower wall, and sidewalls between the upper wall and lower wall;
   and a second rotation driver coupled to the plurality of plasma generators to rotate the plurality of plasma generators in a clockwise direction or a counter-clockwise direction by the second rotation driver when viewed in a plan view,
   wherein a subset of the plurality of plasma generators are disposed on an upper end portion of the second rotation driver with their respective outlets facing the upper wall of the chamber in at least one configuration, and wherein a different subset of the plurality of plasma generators are disposed on a lower end portion of the second rotation driver with their respective outlets facing the lower wall of the chamber in at least one configuration.

8. The plasma treatment apparatus of claim 7, wherein the second rotation driver comprises:
   a second rotation motor configured to generate a rotational force
   a second rotation shaft coupled to the second rotation motor to receive the rotational force from the second rotation motor; and
   a support part comprising a surface for supporting the plurality of plasma generators, the support coupled to the plurality of plasma generators and the second rotation shaft to be rotated, wherein a subset of the plurality of plasma generators are disposed on an upper end portion of the support and a different subset of the plurality of plasma generators are disposed on a lower end portion of the support.

9. The plasma treatment apparatus of claim 5, wherein the third rotation driver comprises:
   a third rotation motor configured to generate a rotational force; and
   a third rotation shaft coupled to the support and the third rotation motor to apply the rotational force generated by the third rotation motor to the support.

10. The plasma treatment apparatus of claim 1, wherein the substrate support comprises:
    a chuck holding the substrate; and
    a motor coupled to the chuck to rotate the chuck.

11. The plasma treatment apparatus of claim 10, further comprising a plurality of substrate supports;
    wherein the chamber houses the plurality of substrate supports, and
    wherein a subset of the plurality of substrate supports are between the upper wall of the chamber and the plasma generator, and a different subset of the plurality of substrate supports are between the lower wall of the chamber and the plasma generator.

12. The plasma treatment apparatus of claim 1, wherein the plasma generator comprises:
    a body;
    a first electrode located in the body;
    a second electrode located in the body and facing the first electrode; and
    a pipe located between the first and second electrodes to flow the source gas therethrough.

13. The plasma treatment apparatus of claim 7, wherein each one of the plurality of plasma generators comprises
    a body;
    a first electrode located in the body;
    a second electrode located in the body and facing the first electrode; and
    a pipe located between the first and second electrodes to flow the source gas therethrough.

* * * * *